(12) United States Patent
Kato et al.

(10) Patent No.: US 6,456,520 B1
(45) Date of Patent: Sep. 24, 2002

(54) SEMICONDUCTOR MEMORY AND METHOD FOR DRIVING THE SAME

(75) Inventors: Yoshihisa Kato, Shiga; Yasuhiro Shimada, Kyoto, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/941,736

(22) Filed: Aug. 30, 2001

(30) Foreign Application Priority Data

Sep. 5, 2000 (JP) ........................................ 2000-268271

(51) Int. Cl.[7] .............................................. G11C 11/22
(52) U.S. Cl. ........................................ 365/145; 365/149
(58) Field of Search .................................. 365/145, 149, 365/65, 117, 104, 177

(56) References Cited

U.S. PATENT DOCUMENTS 5,903,792 A   5/1999   Piccinino, Jr. et al. ...... 396/571
6,188,600 B1 * 2/2001  Ishiwara ...................... 365/145

* cited by examiner

Primary Examiner—David Lam
(74) Attorney, Agent, or Firm—Nixon Peabody LLP; Donald R. Studebaker

(57) ABSTRACT

The semiconductor memory of this invention includes a plurality of ferroelectric capacitors successively connected to one another in a bit line direction each for storing a data in accordance with displacement of polarization of a ferroelectric film thereof; a plurality of selecting transistors respectively connected to the plurality of ferroelectric capacitor in parallel for selecting a selected ferroelectric capacitor from the plural ferroelectric capacitors; a set line connected to a first end of a series circuit including the plural successively connected ferroelectric capacitors to which a reading voltage is applied; and a load capacitor connected to a second end of the series circuit for detecting displacement of polarization of the ferroelectric film of the selected ferroelectric capacitor. In the series circuit, capacitance is larger in a ferroelectric capacitor disposed in a position relatively near to the first end of the series circuit than in a ferroelectric capacitor disposed in a position relatively far from the first end.

11 Claims, 8 Drawing Sheets

US 6,456,520 B1

SEMICONDUCTOR MEMORY AND METHOD FOR DRIVING THE SAME

BACKGROUND OF THE INVENTION

The present invention relates to a semiconductor memory including a ferroelectric capacitor and a method for driving the same.

A first known example of a semiconductor memory including a ferroelectric capacitor is composed of, as shown in FIG. 7, a field effect transistor (hereinafter referred to as the FET) 1 and a ferroelectric capacitor 2 with a drain region 1a of the FET 1 connected to a bit line BL, a source region 1b of the FET 1 connected to an upper electrode of the ferroelectric capacitor 2 and a gate electrode 1c of the FET 1 connected to a word line WL.

The semiconductor memory of the first conventional example employs the destructive read-out system in which a recorded data is erased in reading the data. Therefore, it is necessary to carry out a rewrite operation after a data read operation, and hence, an operation for reversing the polarization direction of the ferroelectric film (polarization reversing operation) should be carried out after every data read operation.

Since a phenomenon designated as polarization fatigue occurs in a ferroelectric film, the polarizing characteristic of the ferroelectric film is largely degraded when the polarization reversing operation is repeatedly carried out.

As a countermeasure, a semiconductor memory of a second conventional example as shown in FIG. 8 has been proposed. Specifically, the semiconductor memory of the second conventional example employs the non-destructive read-out system in which a lower electrode 2b of a ferroelectric capacitor 2 is connected to a gate electrode 1c of an FET 1 so as to use the ferroelectric capacitor 2 for controlling the gate potential of an FET 1. In FIG. 8, a reference numeral 3 denotes a substrate.

In writing a data in the semiconductor memory of the second conventional example, a writing voltage is applied between an upper electrode 2a of the ferroelectric capacitor 2 working as the control gate and the substrate 3.

For example, when a data is written by applying a voltage (control voltage) positive with respect to the substrate 3 to the upper electrode 2a, downward polarization is caused in a ferroelectric film 2c of the ferroelectric capacitor 2. Thereafter, even when the upper electrode 2a is grounded, positive charge remains in the gate electrode 1c of the FET 1, and hence, the gate electrode 1c has a positive potential.

When the potential of the gate electrode 1c exceeds the threshold voltage of the FET 1, the FET 1 is in an on-state. Therefore, when a potential difference is caused between a drain region 1a and a source region 1b of the FET 1, a current flows between the drain region 1a and the source region 1b. Such a logical state of the ferroelectric memory is defined, for example, as "1".

On the other hand, when a voltage negative with respect to the substrate 3 is applied to the upper electrode 2a of the ferroelectric capacitor 2, upward polarization is caused in the ferroelectric film 2c of the ferroelectric capacitor 2. Thereafter, even when the upper electrode 2a is grounded, negative charge remains in the gate electrode 1c of the FET 1, and hence, the gate electrode 1c has a negative potential. In this case, the potential of the gate electrode 1c is always lower than the threshold voltage of the FET 1, and hence, the FET 1 is in an off-state. Therefore, even when a potential difference is caused between the drain region 1a and the source region 1b of the FET 1, no current flows between the drain region 1a and the source region 1b. Such a logical state of the ferroelectric memory is defined, for example, as "0".

Even when the power supply to the ferroelectric capacitor 2 is shut off, namely, even when the voltage application to the upper electrode 2a of the ferroelectric capacitor 2 is stopped, the aforementioned logical states are retained, and thus, a nonvolatile memory is realized. Specifically, when power is supplied again to apply a voltage between the drain region 1a and the source region 1c after shutting off the power supply for a given period of time, a current flows between the drain region 1a and the source region 1b if the logical state is "1", so that the data "1" can be read, and no current flows between the drain region 1a and the source region 1b if the logical state is "0", so that the data "0" can be read.

In order to correctly retain a data while the power is being shut off (which characteristic for retaining a data is designated as retention), it is necessary to always keep the potential of the gate electrode 1c of the FET 1 to be higher than the threshold voltage of the FET 1 when the data is "1" and to always keep the potential of the gate electrode 1c of the FET 1 at a negative voltage when the data is "0".

While the power is being shut off, the upper electrode 2a of the ferroelectric capacitor 2 and the substrate 3 have a ground potential, and hence, the potential of the gate electrode 1c is isolated. Therefore, ideally, as shown in FIG. 9, a first intersection c between a hysteresis loop 4 obtained in writing a data in the ferroelectric capacitor 2 and a gate capacitance load line 7 of the FET 1 obtained when a bias voltage is 0 V corresponds to the potential of the gate electrode 1c obtained in storing a data "1", and a second intersection d between the hysteresis loop 4 and the gate capacitance load line 7 corresponds to the potential of the gate electrode 1c obtained in storing a data "0". In FIG. 9, the ordinate indicates charge Q appearing in the upper electrode 2a (or the gate electrode 1c) and the abscissa indicates voltage V.

Actually, however, the ferroelectric capacitor 2 is not an ideal insulator but has a resistance component, and hence, the potential of the gate electrode 1c drops through the resistance component. This potential drop is exponential and has a time constant obtained by multiplying parallel combined capacitance of the gate capacitance of the FET 1 and the capacitance of the ferroelectric capacitor 2 by the resistance component of the ferroelectric capacitor 2. The time constant is approximately $10^4$ seconds at most. Accordingly, the potential of the gate electrode 1c is halved within several hours.

Since the potential of the gate electrode 1c is approximately 1 V at the first intersection c as shown in FIG. 9, when the potential is halved, the potential of the gate electrode 1c becomes approximately 0.5 V, which is lower than the threshold voltage of the FET 1 (generally of approximately 0.7 V). As a result, the FET 1 that should be in an on-state is turned off in a short period of time.

In this manner, although the ferroelectric memory using the ferroelectric capacitor for controlling the gate potential of the FET has an advantage that a rewrite operation is not necessary after a data read operation, it has the following problem: The gate electrode of the FET obtains a potential after writing a data, and the ability for keeping the gate potential determines the retention characteristic. Since the time constant until discharge of the ferroelectric capacitor is short due to the resistance component of the ferroelectric capacitor, the data retaining ability is short, namely, the retention characteristic is not good.

For overcoming this problem, the present inventors have considered a semiconductor memory as shown in FIG. 10. Hereinafter, the semiconductor memory of FIG. 10 set forth as a premise of the invention is designated as a premise semiconductor memory.

In a memory cell block in the first column of the premise semiconductor memory, a plurality of ferroelectric capacitors, for example, four ferroelectric capacitors CF11, CF21, CF31 and CF41 are serially connected to one another in a bit line direction, and the ferroelectric capacitors CF11, CF21, CF31 and CF41 are respectively connected to cell selecting field effect transistors (hereinafter simply referred to as the cell selecting transistors) Q11, Q21, Q31 and Q41 in parallel. Thus, each of the ferroelectric capacitor and a corresponding one of the cell selecting transistors together form a memory cell. To a lower end of a series circuit in the first column including the serially connected plural ferroelectric capacitors CF11, CF21, CF31 and CF41, a first reading field effect transistor (hereinafter simply referred to as the reading transistor) Q51 is connected for reading a data by detecting displacement of the polarization of a ferroelectric film of a ferroelectric capacitor selected from the plural ferroelectric capacitors CF11, CF21, CF31 and CF41.

Also, in a memory cell block in the second column, similarly to the first memory cell block, a plurality of ferroelectric capacitors CF12, CF22, CF32 and CF42 are serially connected to one another in the bit line direction, and the ferroelectric capacitors CF12, CF22, CF32 and CF42 are respectively connected to cell selecting transistors Q12, Q22, Q32 and Q42 in parallel. To a lower end of a series circuit in the second column including the plural serially connected ferroelectric capacitors CF12, CF22, CF32 and CF42, a second reading transistor Q52 is connected for reading a data by detecting displacement of the polarization of a ferroelectric film of a selected ferroelectric capacitor.

The gate electrodes of the cell selecting transistors Q11 and Q12 included in the memory cells disposed on the first row are connected to a first word line WL1, the gate electrodes of the cell selecting transistors Q21 and Q22 included in the memory cells disposed on the second row are connected to a second word line WL2, the gate electrodes of the cell selecting transistors Q31 and Q32 included in the memory cells disposed on the third row are connected to a third word line WL3, and the gate electrodes of the cell selecting transistors Q41 and Q42 included in the memory cells disposed on the fourth row are connected to a fourth word line WL4.

An upper end of the series circuit in the first column, namely, the upper electrode of the ferroelectric capacitor CF11 disposed on the first row, is connected to a first control line (first set line) BS1, the lower end of the series circuit in the first column, namely, the lower electrode of the ferroelectric capacitor CF41 disposed on the fourth row, is connected to the gate electrode of the first reading transistor Q51, and the drain region of the first reading transistor Q51 is connected to a first bit line BL1.

An upper end of the series circuit in the second column, namely, the upper electrode of the ferroelectric capacitor CF12 disposed on the first row, is connected to a second control line (second set line) BS2, the lower end of the series circuit in the second column, namely, the lower electrode of the ferroelectric capacitor CF42 disposed on the fourth row, is connected to the gate electrode of the second reading transistor Q52, and the drain region of the second reading transistor Q52 is connected to a second bit line BL2.

The source region of the first reading transistor Q51 and the source region of the second reading transistor Q52 are connected to a plate line (reset line) CP.

A write operation of the premise semiconductor memory will now be described. In the following description, a data is written in, for example, the ferroelectric capacitor CF21 included in the memory cell disposed in the first column and on the second row.

First, a high voltage is applied to the word lines WL1, WL3 and WL4 so as to turn on the cell selecting transistors Q11, Q31 and Q41, and a ground voltage is applied to the word line WL2 so as to turn off the cell selecting transistor Q21. In this manner, the ferroelectric capacitor CF21 is selected, and the capacitance of the ferroelectric capacitor CF21 and the gate capacitance of the first reading transistor Q51 are serially connected to each other. Therefore, one end of the series capacitance circuit is connected to the well region of the first reading transistor Q51 and the other end of the series capacitance circuit is connected to the first control line BS1.

Next, when the well region of the first reading transistor Q51 is grounded and a writing voltage is applied to the first control line BS1, the polarization direction of the ferroelectric capacitor CF21 is changed in accordance with the polarity of the writing voltage. Thereafter, when a high voltage is applied to the word line WL2 so as to turn on the cell selecting transistor Q21, the upper electrode and the lower electrode of the ferroelectric capacitor CF21 are short-circuited, resulting in resetting the ferroelectric capacitor CF21.

A read operation for reading a data from the ferroelectric capacitor CF21 included in the memory cell disposed in the first column and on the second row is carried out as follows:

First, in the same manner as in a write operation, a high voltage is applied to the word lines WL1, WL3 and WL4 so as to turn on the cell selecting transistors Q11, Q31 and Q41, and a ground voltage is applied to the word line WL2 so as to turn off the cell selecting transistor Q21. Thus, the ferroelectric capacitor CF21 is selected, and the capacitance of the ferroelectric capacitor CF21 and the gate capacitance of the first reading transistor Q51 are serially connected to each other. Therefore, one end of the series capacitance circuit is connected to the well region of the first reading transistor Q51 and the other end is connected to the first control line BS1.

Next, the well region of the first reading transistor Q51 is grounded and a reading voltage is applied to the first control line BS1. Thus, a voltage obtained by dividing the reading voltage in accordance with a capacitance ratio between the capacitance of the ferroelectric capacitor CF21 and the gate capacitance of the first reading transistor Q51 is applied to the gate electrode of the first reading transistor Q51, a current flows between the drain region and the source region of the first reading transistor Q51 in accordance with the potential of the gate electrode thereof, and the current flows between the plate line CP and the first bit line BL1.

In the premise semiconductor memory, the polarization value of a ferroelectric film is different depending upon a data written in a ferroelectric capacitor including the ferroelectric film, and hence, the change of the polarization value of the ferroelectric film caused in applying a reading voltage is also different depending upon the data. Since a ratio of the change of a polarization value to the change of a voltage corresponds to capacitance, the capacitance of a ferroelectric capacitor is different depending upon the polarization value of a ferroelectric film corresponding to a written data. In other words, the capacitance of the selected ferroelectric capacitor CF21 has a different value depending upon the polarization value of the ferroelectric film of the ferroelectric capacitor CF21.

The gate voltage of the first reading transistor Q51 is determined on the basis of capacitance division between the capacitance of the ferroelectric capacitor CF21 and the gate capacitance of the first reading transistor Q51. Therefore, the gate capacitance of the first reading transistor Q51 is changed depending upon the polarization value of the ferroelectric film of the ferroelectric capacitor CF21.

Accordingly, in accordance with a data written in the ferroelectric capacitor CF21, a value of a current flowing between the source region and the drain region of the first reading transistor Q51 is changed. When this change of the current value is detected, the data written in the ferroelectric capacitor CF21 can be read.

As described above, in the premise semiconductor memory, the ferroelectric capacitor is reset after writing a data therein, and hence, no voltage is applied to the ferroelectric capacitor during data retention time. Therefore, this semiconductor memory has a good retention characteristic. Specifically, the premise semiconductor memory can attain a good retention characteristic by retaining the polarization state of a ferroelectric film instead of retaining a potential difference caused in a ferroelectric capacitor.

In the premise semiconductor memory, however, parasitic capacitances between the respective ferroelectric capacitors and the reading transistor are different depending upon the addresses of the ferroelectric capacitors. For example, when the parasitic capacitance present between the ferroelectric capacitor CF41 on the fourth row and the first reading transistor Q51 is assumed to be q, and the parasitic capacitance of each of the cell selecting transistors Q11, Q21, Q31 and Q41 is assumed to be $q_1$ the parasitic capacitance present in reading a data from the ferroelectric capacitor CF41 on the fourth row is $q_1$ while the parasitic capacitance present in reading a data from the ferroelectric capacitor CF11 on the first row is $q_1 + 3 \times q_2$.

Since the parasitic capacitances present between the respective ferroelectric capacitors and the reading transistor are thus different depending upon the addresses, the gate voltage of the reading transistor is varied depending upon the address of a ferroelectric capacitor to be read in a read operation. This disadvantageously makes the operation of the reading transistor unstable.

SUMMARY OF THE INVENTION

In consideration of the aforementioned disadvantage, an object of the invention is stabilizing the operation of a reading transistor although parasitic capacitance present between each ferroelectric capacitor and a reading transistor is different depending upon the address of the ferroelectric capacitor.

In order to achieve the object, the semiconductor memory of this invention comprises a plurality of ferroelectric capacitors successively connected to one another in a bit line direction each for storing a data in accordance with displacement of polarization of a ferroelectric film thereof; a plurality of selecting transistors respectively connected to the plurality of ferroelectric capacitors in parallel for selecting a selected ferroelectric capacitor from the plurality of ferroelectric capacitors; a set line connected to a first end of a series circuit including the plurality of successively connected ferroelectric capacitors, a reading voltage being applied to the set line; and a load capacitor connected to a second end of the series circuit for detecting displacement of polarization of the ferroelectric film of the selected ferroelectric capacitor, and in the series circuit, capacitance is set to be larger in a ferroelectric capacitor disposed in a position relatively near to the first end than in a ferroelectric capacitor disposed in a position relatively far from the first end.

In the semiconductor memory of this invention, in the series circuit including the plural ferroelectric capacitors, the capacitance is set to be higher in a ferroelectric capacitor disposed in a position relatively near to the end for receiving the reading voltage than in a ferroelectric capacitor disposed in a position relatively far from the end. Therefore, even through parasitic capacitances present between the ferroelectric capacitors and the reading transistor are different depending upon the addresses, a difference in the voltage applied to the load capacitor in a read operation can be reduced, so that the displacement of the polarization of the ferroelectric film of the selected ferroelectric capacitor can be stably detected.

In the semiconductor memory, the capacitance of each of the ferroelectric capacitors is preferably set to be in proportion to a sum of parasitic capacitance present between the ferroelectric capacitor and the load capacitor, and capacitance of the load capacitor. For example, assuming that a first ferroelectric capacitor has capacitance $Q_{1A}$, that a second ferroelectric capacitor has capacitance $Q_{1B}$, that parasitic capacitance $Q_{2A}$ is present between the first ferroelectric capacitor and the load capacitor, that parasitic capacitance $Q_{2B}$ is present between the second ferroelectric capacitor and the load capacitor, and that the load capacitor has capacitance $Q_3$, the capacitances $Q_{1A}$ and $Q_{1B}$ are preferably set so that the relationship of $$Q_{1A}/Q_{1B} = (Q_{2A} + Q_3)/(Q_{2B} + Q_3)$$

can hold.

When the capacitances are thus set, even when the parasitic capacitances present between the ferroelectric capacitors and the reading transistor are different depending upon the addresses, the voltage applied to the load capacitor is the same in reading a data from any of the ferroelectric capacitors. Accordingly, the displacement of the polarization of the ferroelectric film of the selected ferroelectric capacitor can be very stably detected.

In the semiconductor memory, in the series circuit, one electrode having a smaller area between two electrodes of each of the plurality of ferroelectric capacitors preferably has a larger area in a ferroelectric capacitor disposed in a position relatively near to the first end than in a ferroelectric capacitor disposed in a position relatively far from the first end.

Thus, in the series circuit including the plural ferroelectric capacitors, the capacitance can be easily and definitely set to be larger in a ferroelectric capacitor disposed in a position relatively near to the end for receiving the reading voltage than in a ferroelectric capacitor disposed in a position relatively far from the end.

In the semiconductor memory, in the series circuit, the ferroelectric film preferably has a smaller thickness in a ferroelectric capacitor disposed in a position relatively near to the first end than in a ferroelectric capacitor disposed in a position relatively far from the first end.

Thus, in the series circuit including the plural ferroelectric capacitors, the capacitance can be easily and definitely set to be larger in a ferroelectric capacitor disposed in a position relatively near to the end for receiving the reading voltage than in a ferroelectric capacitor disposed in a position relatively far from the end.

In the semiconductor memory, in the series circuit, an amount of a dopant added to the ferroelectric film is preferably larger in a ferroelectric capacitor disposed in a position relatively near to the first end than in a ferroelectric capacitor disposed in a position relatively far from the first end.

Thus, in the series circuit including the plural ferroelectric capacitors, the capacitance can be easily and definitely set to be larger in a ferroelectric capacitor disposed in a position relatively near to the end for receiving the reading voltage than in a ferroelectric capacitor disposed in a position relatively far from the end.

In the semiconductor memory, the reading voltage applied to the set line is preferably set to such magnitude that a voltage applied between two electrodes of the selected ferroelectric capacitor in applying the reading voltage is not more than a coercive voltage of the selected ferroelectric capacitor.

Thus, the displacement of the polarization of the ferroelectric film can be restored to that obtained before reading a data, and hence, there is no need to carry out a rewrite operation. As a result, the fatigue characteristic of the ferroelectric capacitor can be improved.

In the semiconductor memory, the load capacitor is preferably a field effect transistor whose gate electrode is connected to the second end of the series circuit.

Thus, the displacement of the polarization of the ferroelectric film can be definitely detected by detecting a current flowing between the drain region and the source region of the field effect transistor.

The method for driving a semiconductor memory of this invention is employed in a semiconductor memory including a plurality of ferroelectric capacitors successively connected to one another in a bit line direction each for storing a data in accordance with displacement of polarization of a ferroelectric film thereof; a plurality of selecting transistors respectively connected to the plurality of ferroelectric capacitors in parallel for selecting a selected ferroelectric capacitor from the plurality of ferroelectric capacitors; a set line connected to a first end of a series circuit including the plurality of successively connected ferroelectric capacitors, a reading voltage being applied to the set line; and a load capacitor connected to a second end of the series circuit for detecting displacement of polarization of the ferroelectric film of the selected ferroelectric capacitor, with capacitances of the plurality of ferroelectric capacitors being set to be equal to one another, and the method comprises a step of setting the reading voltage applied to the set line to be lower in reading a data from a ferroelectric capacitor disposed in a position in the series circuit relatively near to the first end than in reading a data from a ferroelectric capacitor disposed in a position relatively far from the first end.

In the method for driving a semiconductor memory of this invention, in the series circuit including the plural ferroelectric capacitors, the reading voltage is set to be lower in reading a data from a ferroelectric capacitor disposed in a position relatively near to the end for receiving the reading voltage than in reading a data from a ferroelectric capacitor disposed in a position relatively far from the end. Therefore, even through parasitic capacitances present between the ferroelectric capacitors and the reading transistor are different depending upon the addresses, a different in the voltage applied to the load capacitor in a read operation can be reduced. As a result, the displacement of the polarization of the ferroelectric film of the selected ferroelectric capacitor can be stably detected.

In the method for driving a semiconductor memory, magnitude of the reading voltage is preferably set to be in reverse proportion to a sum of parasitic capacitance present between the selected ferroelectric capacitor and the load capacitor, and capacitance of the load capacitor. For example, assuming that a data is read from a first ferroelectric capacitor by applying a reading voltage $V_{RA}$, that a data is read from a second ferroelectric capacitor by applying a reading voltage $V_{RB}$, that parasitic capacitance $Q_{2A}$ is present between the first ferroelectric capacitor and the load capacitor, that parasitic capacitance $Q_{2B}$ is present between the second ferroelectric capacitor and the load capacitor, and that the load capacitor has capacitance $Q_3$, the reading voltages $V_{RA}$ and $V_{RB}$ are preferably set so that the relationship $V_{RA}/V_{RB}=(Q_{2B}+Q_3)/(Q_{2A}+Q_3)$ can hold.

When the reading voltages are thus set, even through the parasitic capacitances present between the ferroelectric capacitors and the reading transistor are different depending upon the addresses, the voltage applied to the load capacitor is the same in reading a data from any of the ferroelectric is capacitors. As a result, the displacement of the polarization of the ferroelectric film of the selected ferroelectric capacitor can be very stably detected.

In the method for driving a semiconductor memory, the reading voltage applied to the set line is preferably set to such magnitude that a voltage applied between two electrodes of the selected ferroelectric capacitor in applying the reading voltage is not more than a coercive voltage of the selected ferroelectric capacitor.

Thus, the displacement of the polarization of the ferroelectric film can be restored to that obtained before reading a data, and hence, there is no need to carry out a rewrite operation. As a result, the fatigue characteristic of the ferroelectric capacitor can be improved.

In the method for driving a semiconductor memory, the load capacitor is preferably a field effect transistor whose gate electrode is connected to the second end of the series circuit.

Thus, the displacement of the polarization of the ferroelectric film can be definitely detected by detecting a current flowing between the drain region and the source region of the field effect transistor.

DETAILED DESCRIPTION OF THE INVENTION

Embodiment 1

A semiconductor memory and a driving method for the same according to Embodiment 1 of the invention will now be described with reference to FIGS. 1 through 4.

Figure 1:
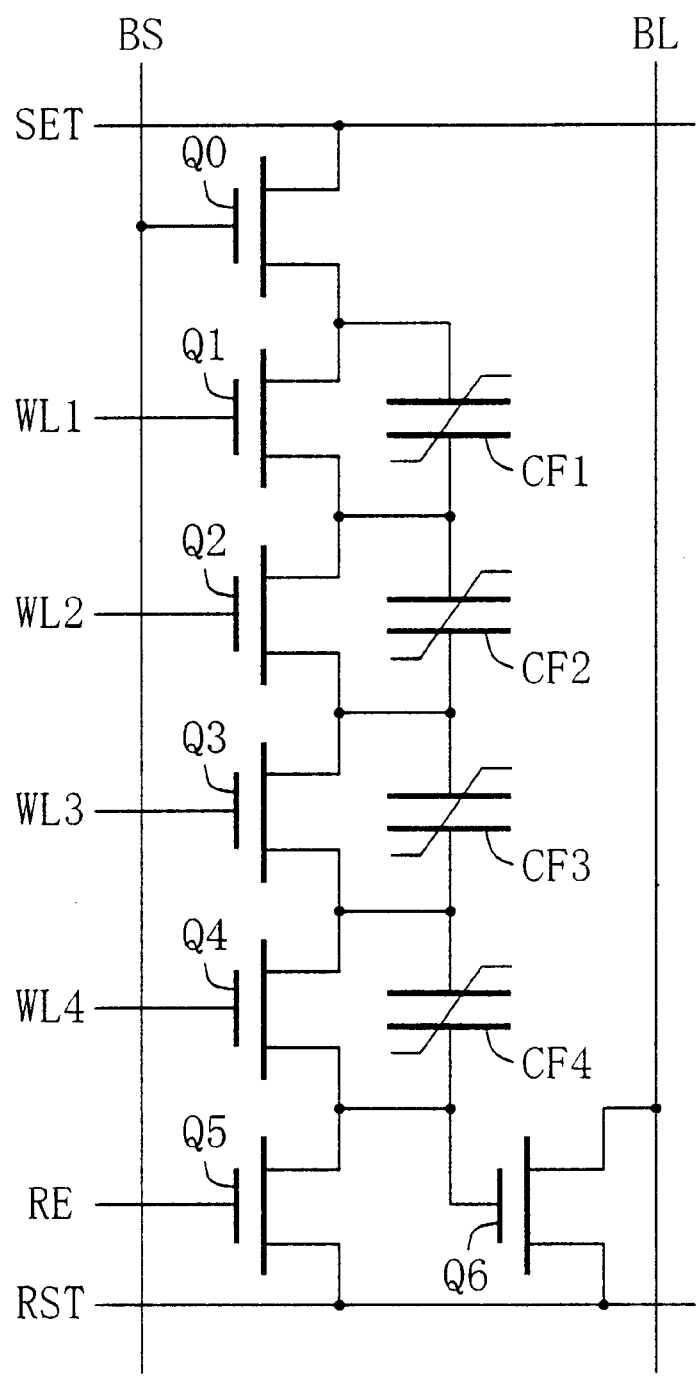
FIG. 1 is an equivalent circuit diagram of a memory cell block included in a semiconductor memory according to Embodiment 1 or 2 of the invention.

FIG. 1 is an equivalent circuit diagram of one memory cell block included in the semiconductor memory of Embodiment 1. In the memory cell block, a plurality of ferroelectric capacitors, for example, four ferroelectric capacitors CF1, CF2, CF3 and CF4 are serially connected to one another in a bit line direction, and the ferroelectric capacitors CF1, CF2, CF3 and CF4 are respectively connected to cell selecting transistors Q1, Q2, Q3 and Q4 in parallel. Each of the ferroelectric capacitors and a corresponding one of the cell selecting transistors together form a memory cell.

An upper end of a first series circuit including the plural serially connected ferroelectric capacitors CF1, CF2, CF3 and CF4 and an upper end of a second series circuit including the plural serially connected cell selecting transistors Q1, Q2, Q3 and Q4 are connected to a set line SET through a block selecting field effect transistor (hereinafter simply referred to as the block selecting transistor) Q0. The gate electrode of the block selecting transistor Q0 is connected to a block selecting line BS.

A lower end of the first series circuit including the plural serially connected ferroelectric capacitors CF1, CF2, CF3 and CF4 and a lower end of the second series circuit including the plural serially connected cell selecting transistors Q1, Q2, Q3 and Q4 are connected to a reset line RST through a writing field effect transistor (hereinafter simply referred to as the writing transistor) Q5. The gate electrode of the writing transistor Q5 is connected to a writing transistor control line RE.

Also, a lower end of the first series circuit including the plural serially connected ferroelectric capacitors CF1, CF2, CF3 and CF4 is connected to the gate electrode of a reading transistor Q6 for reading a data by detecting displacement of polarization of the ferroelectric film of a selected one of the ferroelectric capacitors CF1, CF2, CF3 and CF4. The drain region of the reading transistor Q6 is connected to a bit line BL and the source region of the reading transistor Q6 is connected to the reset line RST.

The gate electrode of the cell selecting transistor Q1 included in the memory cell disposed on the first row is connected to a first word line WL1, the gate electrode of the cell selecting transistor Q2 included in the memory cell disposed on the second row is connected to a second word line WL2, the gate electrode of the cell selecting transistor Q3 included in the memory cell disposed on the third row is connected to a third word line WL3, and the gate electrode of the cell selecting transistor Q4 included in the memory cell disposed on the fourth row is connected to a fourth word line WL4.

(Data Write Operation)

Now, a data write operation of the semiconductor memory of Embodiment 1 will be described. In the following description, a data is written in, for example, the ferroelectric capacitor CF2 included in the memory cell disposed on the second row.

First, a high signal is applied to the block selecting line BS, the writing transistor control line RE and the word lines WL1, WL3 and WL4 connected to the gate electrodes of the cell selecting transistors Q1, Q3 and Q4 included in the memory cells not to be selected, so as to turn on the block selecting transistor Q0, the writing transistor Q5 and the cell selecting transistors Q1, Q3 and Q4. Thus, the memory cell disposed on the second row in the memory cell block of FIG. 1 is selected.

Next, in writing a data "1", a high signal is applied to the set line SET and a low signal is applied to the reset line RST, and in writing a data "0", a low signal is applied to the set line SET and a high signal is applied to the reset line RST.

In this manner, the signal applied to the set line SET is applied to the upper electrode of the ferroelectric capacitor CF2, and the signal applied to the reset line RST is applied to the lower electrode of the ferroelectric capacitor CF2. Therefore, in writing a data "1", downward polarization is caused in the ferroelectric film of the ferroelectric capacitor CF2, and in writing a data "0", upward polarization is caused in the ferroelectric film of the ferroelectric capacitor CF2.

When a write operation is completed, all the signal lines are set to a low potential, and then, a high signal is applied to the word line WL2 connected to the gate electrode of the cell selecting transistor Q2 included in the selected memory cell.

Thus, the cell selecting transistor Q2 is turned on, so as to electrically connect the upper electrode and the lower electrode of the ferroelectric capacitor CF2. As a result, the potential difference caused between the upper electrode and the lower electrode becomes zero.

Thereafter, the potential of the word line WL2 is restored to a low potential. Thus, even when the power supply is shut off, the polarization direction in the ferroelectric film of the ferroelectric capacitor CF2 can be retained, and hence, the data written in the ferroelectric capacitor CF2 can be retained.

(Data Read Operation)

Now, a read operation for reading a data from the ferroelectric capacitor CF2 included in the memory cell disposed on the second row will be described.

First, a high signal is applied to the block selecting line BS and the word lines WL1, WL3 and WL4 connected to the gate electrodes of the cell selecting transistors Q1, Q3 and Q4 included in the memory cells not to be selected, so as to turn on the block selecting transistor Q0 and the cell selecting transistors Q1, Q3 and Q4. Thus, the set line SET is connected to the upper electrode of the ferroelectric capacitor CF2, and the lower electrode of the ferroelectric capacitor CF2 is connected to the gate electrode of the reading transistor Q6.

Next, a reading voltage (of, for example, 2 V) is applied to the set line SET. Thus, a voltage obtained by dividing the reading voltage in accordance with a capacitance ratio between the capacitance of the ferroelectric capacitor CF2 and the gate capacitance of the reading transistor Q6 is applied to the gate electrode of the reading transistor Q6.

Since the polarization direction in the ferroelectric film of the ferroelectric capacitor CF2 is different between the case where a data "1" is stored therein and the case where a data "0" is stored therein, the shape of a hysteresis line is different between these cases. Therefore, the magnitude of the voltage applied to the gate electrode of the reading transistor Q6 is different between these cases. Accordingly, the gate potential of the reading transistor Q6 is different depending upon the stored data.

When a voltage is applied between the bit line BL and the reset line RST under this condition, a current in accordance with the gate potential of the reading transistor Q6 flows between the drain region and the source region of the reading transistor Q6. Therefore, when voltage change caused in load resistance connected to the bit line BL is detected on the basis of this current, the data stored in the ferroelectric capacitor CF2 can be read.

When the read operation is completed, all the signal lines are set to a low potential, and then, a high signal is applied to the word line WL2 connected to the gate electrode of the cell selecting transistor Q2 included in the selected memory cell.

During the read operation, the gate potential of the reading transistor Q6 that is a floating node is varied due to a leakage current through the ferroelectric capacitor CF2 and the cell selecting transistor Q2, and the floating node potential is thus reset.

Figure 2:
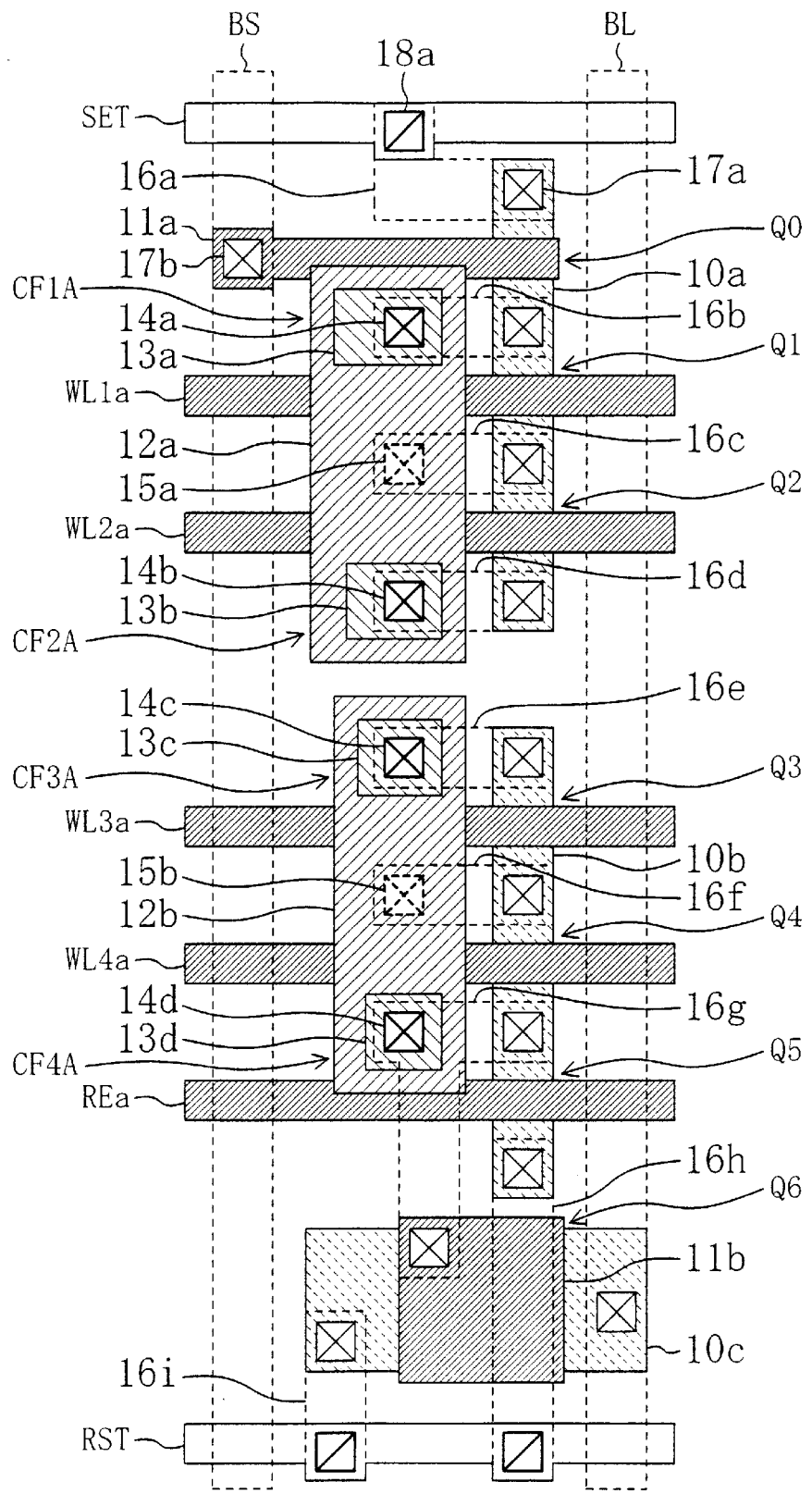
FIG. 2 is a plane view of the semiconductor memory of Embodiment 1.

FIG. 2 is a plane view of the semiconductor memory of Embodiment 1. The semiconductor memory of FIG. 2 has the so-called planer structure in which a field effect transistor and a ferroelectric capacitor are connected to each other through a local interconnect, which is realized by a metal interconnect having a two-layered structure. Ferroelectric capacitors CF1A, CF2A, CF3A and CF4A of FIG. 2 respectively correspond to the ferroelectric capacitors CF1, CF2, CF3 and CF4 of FIG. 1.

As a characteristic of the semiconductor memory of Embodiment 1, in the first series circuit including the plural serially connected ferroelectric capacitors CF1A, CF2A, CF3A and CF4A, the capacitance is set to be larger in a ferroelectric capacitor disposed in a position relatively near to the upper end of the first series circuit than in a ferroelectric capacitor disposed in a position relatively far from the upper end. Specifically, the capacitance is larger in the ferroelectric capacitor CF1A on the first row than in the ferroelectric capacitor CF2A on the second row, is larger in the ferroelectric capacitor CF2A on the second row than in the ferroelectric capacitor CF3A on the third row, and is larger in the ferroelectric capacitor CF3A on the third row than in the ferroelectric capacitor CF4A on the fourth row.

In FIG. 2, the set line SET and the reset line RST are formed from metal interconnects disposed in an upper layer and the block selecting line BS and the bit line BL are formed from metal interconnects disposed in a lower layer.

In FIG. 2, reference numerals 10a, 10b and 10c denote active regions; a reference numeral 11a denotes a polysilicon gate of the block selecting transistor Q0 connected to the block selecting line BS; WL1a, WL2a, WL3a and WL4a denote word lines as well as polysilicon gates of the cell selecting transistors Q1, Q2, Q3 and Q4, respectively; REa denotes a writing transistor control line as well as a polysilicon gate of the reading transistor Q5; and a reference numeral 11b denotes a polysilicon gate of the reading transistor.

Also in FIG. 2, a reference numeral 12a denotes a lower electrode of the ferroelectric capacitors CF1A and CF2A, a reference numeral 12b denotes a lower electrode of the ferroelectric capacitors CF3A and CF4A, and reference numerals 13a, 13b, 13c and 13d denote upper electrodes of the ferroelectric capacitors CF1A, CF2A, CF3A and CF4A, respectively. Accordingly, an overlap region between the lower electrode 12a and the upper electrode 13a corresponds to the ferroelectric capacitor CF1A, an overlap region between the lower electrode 12a and the upper electrode 13b corresponds to the ferroelectric capacitor CF2A, an overlap region between the lower electrode 12b and the upper electrode 13c corresponds to the ferroelectric capacitor CF3A, and an overlap region between the lower electrode 12b and the upper electrode 13d corresponds to the ferroelectric capacitor CF4A. Also, in FIG. 2, reference numerals 14a, 14b, 14c and 14d denote contacts of the upper electrodes 13a, 13b, 13c and 13d, respectively, and reference numerals 15a and 15b denote contacts of the lower electrodes 12a and 12b, respectively.

In FIG. 2, portions of the active regions 10a, 10b and 10c overlapping the polysilicon gates 11a, WL1a, WL2a, WL3a, WL4a, REa and 11b correspond to gates, and portions of the active regions 10a, 10b and 10c not overlapping the polysilicon gates 11a, WL1a, WL2a, WL3a, WL4a, REa and 11b correspond to source or drain regions.

As shown in FIG. 2, the source region of the block selecting transistor Q0 is connected to the set line SET through a contact hole 17a, a lower metal interconnect 16a and a via hole 18a, and the polysilicon gate 11a is connected to the block selecting line BS through a contact hole 17b. Furthermore, the upper electrode 13a of the ferroelectric capacitor CF1A is connected to the active region 10a of the cell selecting transistor Q1 through a lower metal interconnect 16b. The lower electrode 12a of the ferroelectric capacitors CF1A and CF2A is connected to the active region 10a of the cell selecting transistors Q1 and Q2 through a lower metal interconnect 16c. The upper electrode 13b of the ferroelectric capacitor CF2A is connected to the active region 10a of the cell selecting transistor Q2 through a lower metal interconnect 16d. The upper electrode 13c of the ferroelectric capacitor CF3A is connected to the active region 10b of the cell selecting transistor Q3 through a lower metal interconnect 16e. The lower electrode 12b of the ferroelectric capacitors CF3A and CF4A is connected to the active region l0b of the cell selecting transistors Q3 and Q4 through a lower metal interconnect 16f. The upper electrode 13d of the ferroelectric capacitor CF4A is connected to the active region 10b of the writing transistor Q5 and the polysilicon gate 11b of the reading transistor Q6 through a lower metal interconnect 16g. The reset line RST is connected to the active region 10b of the writing transistor Q5 through a lower metal interconnect 16h, and is connected to the active region 10c of the reading transistor Q6 through a lower metal interconnect 16i.

In the semiconductor memory of FIG. 2, the gate widths of the block selecting transistor Q0, the cell selecting transistors Q1, Q2, Q3 and Q4 and the writing transistor Q5 are set to 2.2 µm and the gate lengths thereof are set to 0.8 µm. The gate width of the reading transistor Q6 is set to 24.0 µm and the gate length thereof is set to 3.0 µm. The gate insulating film of each of the transistors Q0, Q1, Q2, Q3, Q4, Q5 and Q6 is made from a silicon dioxide film having a thickness of 15 nm and a dielectric constant of 3.9.

Accordingly, the gate capacitance of each of the block selecting transistor Q0, the cell selecting transistors Q1, Q2, Q3 and Q4 and the writing transistor Q5 is estimated to be 4 fF (femto-farad) and the gate capacitance of the reading transistor Q6 is estimated to be 166 fF.

Furthermore, in each of the block selecting transistor Q0, the cell selecting transistors Q1, Q2, Q3 and Q4 and the writing transistor Q5, the area of heavily-doped layers serving as the source region and the drain region is $5.3 \mu m^2$ and parasitic capacitance including junction capacitance with a substrate and the like is 5 fF. The sizes of the ferroelectric capacitors CF1A, CF2A, CF3A and CF4A are determined in consideration of the parasitic capacitances.

As shown in FIG. 2, the area of the upper electrode 13a of the ferroelectric capacitor CF1A disposed on the first row is larger than the area of the upper electrode 13b of the ferroelectric capacitor CF2A disposed on the second row; the area of the upper electrode 13b of the ferroelectric capacitor CF2A disposed on the second row is larger than the area of the upper electrode 13c of the ferroelectric capacitor CF3A disposed on the third row; the area of the upper electrode 13c of the ferroelectric capacitor CF3A disposed on the third row is larger than the area of the upper electrode 13d of the ferroelectric capacitor CF4A disposed on the fourth row; and the area of the upper electrode 13d of the ferroelectric capacitor CF4A disposed on the fourth row is set to 25µm². The areas of the upper electrodes 13a, 13b, 13c and 13d are determined on the basis of parasitic capacitances respectively present between the reading transistor Q6 and the ferroelectric capacitors CF1A, CF2A, CF3A and CF4A.

In a path where charge moves from the lower electrode 12b of the ferroelectric capacitor CF3A on the third row to the gate electrode of the reading transistor Q6, there exist two junction capacitances of the cell selecting transistor Q4 and the writing transistor Q5 (capacitances between the sources and the drains of the two transistors, that is, 5 fF ×2), the gate capacitance (4 fF) of the cell selecting transistor Q4 and two fringe field capacitances (0.5 fF×2) and overlap capacitances (1 fF×2) of the cell selecting transistor Q3 and the writing transistor Q5. Line capacitance is negligibly small. Accordingly, the parasitic capacitance existing between the ferroelectric capacitor CF3A on the third row and the gate electrode of the reading transistor Q6 is 17 fF. Also, the gate capacitance of the reading transistor Q6 is 166 fF.

Accordingly, the area of the upper electrode 13c of the ferroelectric capacitor CF3A on the third row is set to 27.3 µm², that is, the area of the upper electrode 13d of the ferroelectric capacitor CF4A on the fourth row (25 µm²)×(1+17 fF/ (166 fF+17 fF)).

Similarly, the area of the upper electrode 13b of the ferroelectric capacitor CF2A on the second row is set to 28.9 µm², that is, the area of the upper electrode 13d of the ferroelectric capacitor CF4A on the fourth row (25 µm²)×(1+31 fF/ (166 fF+31 fF)). The area of the upper electrode 13a of the ferroelectric capacitor CF1A on the first row is set to 30.2µm², that is, the area of the upper electrode 13d of the ferroelectric capacitor CF4A on the fourth row (25µm²)×(1+44 fF/ (166 fF+44 fF)).

Figure 3:
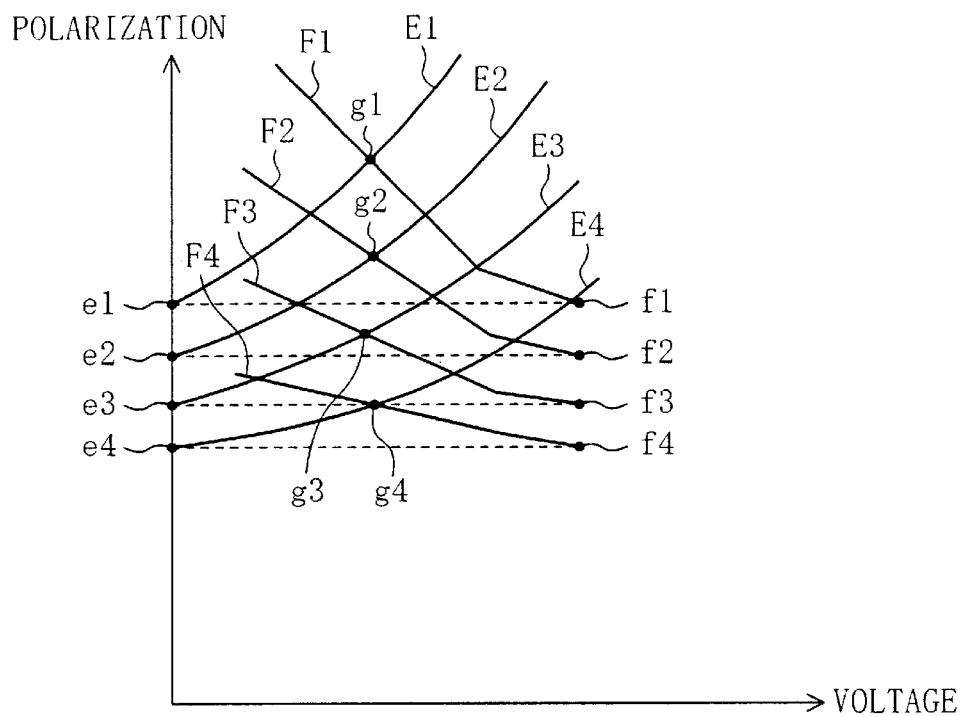
FIG. 3 is a diagram for explaining the relationship between voltage and polarization obtained in reading a data "1" in the semiconductor memory of Embodiment 1.
Figure 4:
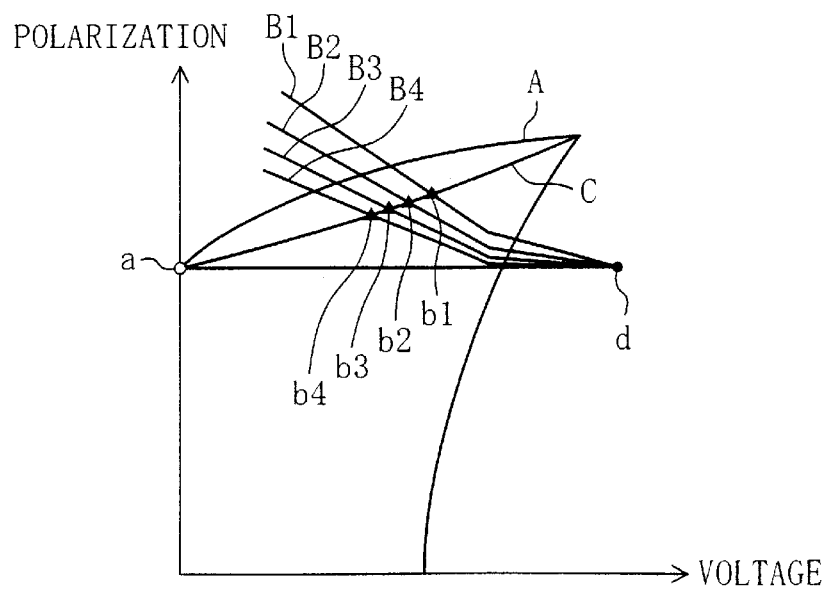
FIG. 4 is a diagram for explaining the relationship between voltage and polarization obtained in reading a data "1" in a conventional semiconductor memory.

Now, an operation for reading a data "1" will be described by using hysteresis lines and load capacitance lines shown in FIGS. 3 and 4. FIG. 3 shows the relationship between polarization and voltage obtained in Embodiment 1 (namely, in the semiconductor memory where the areas of the upper electrodes are different) and FIG. 4 shows that obtained in a conventional semiconductor memory (namely, in a semiconductor memory where the areas of the upper electrodes are the same). In FIGS. 3 and 4, load capacitance lines of all the addresses are shown for making clear differences in operation points among the respective addresses.

In FIG. 4, a line A denotes a saturation hysteresis loop, lines B1, B2, B3 and B4 respectively denote load capacitance lines obtained in reading a data from the ferroelectric capacitors CF1, CF2, CF3 and CF4, a line C denotes a hysteresis line drawn from a retention operation point a obtained in applying a positive voltage to the ferroelectric capacitors CF1, CF2, CF3 and CF4, points b1, b2, b3 and b4 denote read operation points, and a point d denotes a reading voltage applied to the block selecting line BS in a read operation. Potential differences between the retention operation point a and the read operation points b1, b2, b3 and b4 respectively correspond to potential differences caused between the two electrodes of the ferroelectric capacitors CF1, CF2, CF3 and CF4, and potential differences between the reading voltage d and the read operation points b1, b2, b3 and b4 respectively correspond to voltages generated in the gate electrode of the reading transistor Q6 in accessing the ferroelectric capacitors CF4, CF3, CF2 and CF1.

The capacitance load lines B1, B2, B3 and B4 are different from one another in accordance with the addresses of the ferroelectric capacitors CF1, CF2, CF3 and CF4 because the parasitic capacitances are different depending upon the addresses although the gate capacitance of the reading transistor Q6 is constant. Therefore, the read operation points b1, b2, b3 and b4 respectively corresponding to intersections between the hysteresis line C and the load capacitance lines B1, B2, B3 and B4 are different depending upon the addresses, and hence, the drain current of the reading transistor Q6 is varied.

In FIG. 3, points e1, e2, e3 and e4 respectively denote retention operation points of the ferroelectric capacitors CF1A, CF2A, CF3A and CF4A, lines E1, E2, E3 and E4 respectively denote hysteresis lines drawn from the retention operation points e1, e2, e3 and e4 in applying a positive voltage to the ferroelectric capacitors CF1A, CF2A, CF3A and CF4A, lines F1, F2, F3 and F4 respectively denote load capacitance lines of the ferroelectric capacitors CF1A, CF2A, CF3A and CF4A, points f1, f2, f3 and f4 respectively denote reading voltages for the ferroelectric capacitors CF1A, CF2A, CF3A and CF4A, and points g1, g2, g3 and g4 respectively denote read operation points of the ferroelectric capacitors CF1A, CF2A, CF3A and CF4A.

Potential differences respectively between the read operation points g1, g2, g3 and g4 and the retention operation points e1, e2, e3 and e4 correspond to potential differences caused between the two electrodes of the ferroelectric capacitors CF1A, CF2A, CF3A and CF4A. Potential differences respectively between the reading voltages f1, f2, f3 and f4 and the read operation points g1, g2, g3 and g4 correspond to voltages generated in the gate electrode of the reading transistor Q6 in reading a data "1" from the ferroelectric capacitors CF1A, CF2A, CF3A and CF4A.

The gradient of each of the capacitance load lines F1, F2, F3 and F4 corresponds to a sum of the gate capacitance of the reading transistor Q6 and the parasitic capacitance, which is larger in the order of the ferroelectric capacitors CF4A, CF3A, CF2A and CF1A. Also, the polarization values of the ferroelectric films of the ferroelectric capacitors CF1A, CF2A, CF3A and CF4A are respectively in proportion to the areas of the upper electrodes 13a, 13b, 13c and 13d.

Accordingly, since the area of the upper electrode 13a, 13b, 13c or 13d is larger in the order of the ferroelectric capacitors CF4A, CF3A, CF2A and CF1A in Embodiment 1, the polarization value of the ferroelectric film (corresponding to the retention operation point) is also larger in the order of the retention operation points e4, e3, e2 and e1.

Also, the gradients of the hysteresis lines E1, E2, E3 and E4 obtained in applying a positive voltage to the ferroelectric capacitors CF1A, CF2A, CF3A and CF4A corresponding to the retention operation points e1, e2, e3 and e4 are respectively in proportion to the areas of the upper electrodes 13a, 13b, 13c and 13d, and hence, the gradient of the hysteresis line is larger in the order of the hysteresis lines E4, E3, E2 and E1. The reading voltages f1, f2, f3 and f4 are equal to one another because the same reading voltage is applied to the ferroelectric capacitors in all the addresses.

In Embodiment 1, the gradients of the capacitance load lines F1, F2, F3 and F4 are different depending upon the addresses because of the difference in the parasitic capacitance, and hence, the gradients of the hysteresis lines E1, E2, E3 and E4 are accordingly different. Therefore, the read operation points g1, g2, g3 and g4 respectively corresponding to the intersections between the load capacitance lines F1, F2, F3 and F4 and the hysteresis lines E1, E2, E3 and E4 have an equal voltage value. Accordingly, the variation in the gate potential of the reading transistor Q6 depending upon the addresses can be prevented.

Although the ferroelectric capacitors with the planer structure are described in Embodiment 1, the same effect as that of Embodiment 1 can be attained in ferroelectric capacitors with a stack structure when the areas of the electrodes of the ferroelectric capacitors are different depending upon the addresses.

In Embodiment 1, in the first series circuit including the plural ferroelectric capacitors CF1A, CF2A, CF3A and CF4A, the area of one electrode having a smaller area between the upper electrode and the lower electrode is set to be larger in a ferroelectric capacitor disposed in a position relatively near to the upper end of the series circuit than in a ferroelectric capacitor disposed in a position relatively far from the upper end. Instead, the thickness of a ferroelectric film may be set to be smaller in a ferroelectric capacitor disposed in a position relatively near to the upper end of the first series circuit than in a ferroelectric capacitor disposed in a position relatively far from the upper end.

Specifically, the thicknesses of the ferroelectric films of the ferroelectric capacitors CF1A, CF2A, CF3A and CF4A can be made different depending upon the addresses in proportion to the sum of the parasitic capacitance present between the ferroelectric capacitor CF1A, CF2A, CF3A or CF4A and the reading transistor Q6, and the gate capacitance of the reading transistor Q6.

For example, when the areas of the electrodes of the ferroelectric capacitors CF1A, CF2A, CF3A and CF4A are set to be equal and the thickness of the ferroelectric film of the ferroelectric capacitor CF4A on the fourth row is 200 nm, the thickness of the ferroelectric film of the ferroelectric capacitor CF3A on the third row may be set to 181 nm, that is, 200 nm×(1−17 fF/(166 fF+17 fF)), the thickness of the ferroelectric film of the ferroelectric capacitor CF2A on the second row may be set to 169 nm, that is, 200 nm×(1−31 fF/(166 fF+31 fF)), and the thickness of the ferroelectric film of the ferroelectric capacitor CF1A on the first row may be set to 158 nm, that is, 200 nm×(1−44 fF/ (166 fF+44 fF)).

Alternatively, in the first series circuit including the plural ferroelectric capacitors CF1A, CF2A, CF3A and CF4A, the amount of a dopant added to the ferroelectric film may be larger in a ferroelectric capacitor disposed in a position relatively near to the upper end of the series circuit than in a ferroelectric capacitor disposed in a position relatively far from the upper end.

For example, in the case where the ferroelectric film is made from strontium bismuth tantalate ($SrBi_2Ta_2O_9$), the amount of niobium (Nb) to be added is controlled depending upon the addresses in accordance with the parasitic capacitance ratio. Specifically, in forming ferroelectric films by metal organic decomposition (MOD), different MOD solutions are used in patterning depending upon the addresses. In this case, the amounts of Nb added to the respective MOD solutions are made different depending upon the addresses.

Embodiment 2

A semiconductor memory and a driving method for the same according to Embodiment 2 of the invention will now be described with reference to FIGS. 1, 5 and 6.

The semiconductor memory of Embodiment 2 has the equivalent circuit shown in FIG. 1 similarly to the semiconductor memory of Embodiment 1, but a plurality of ferroelectric capacitors CF1, CF2, CF3 and CF4 have the same capacitance differently from those of Embodiment 1. Specifically, the areas of the upper electrodes and the lower electrodes of the plural ferroelectric capacitors CF1, CF2, CF3 and CF4 are the same.

Figure 5:
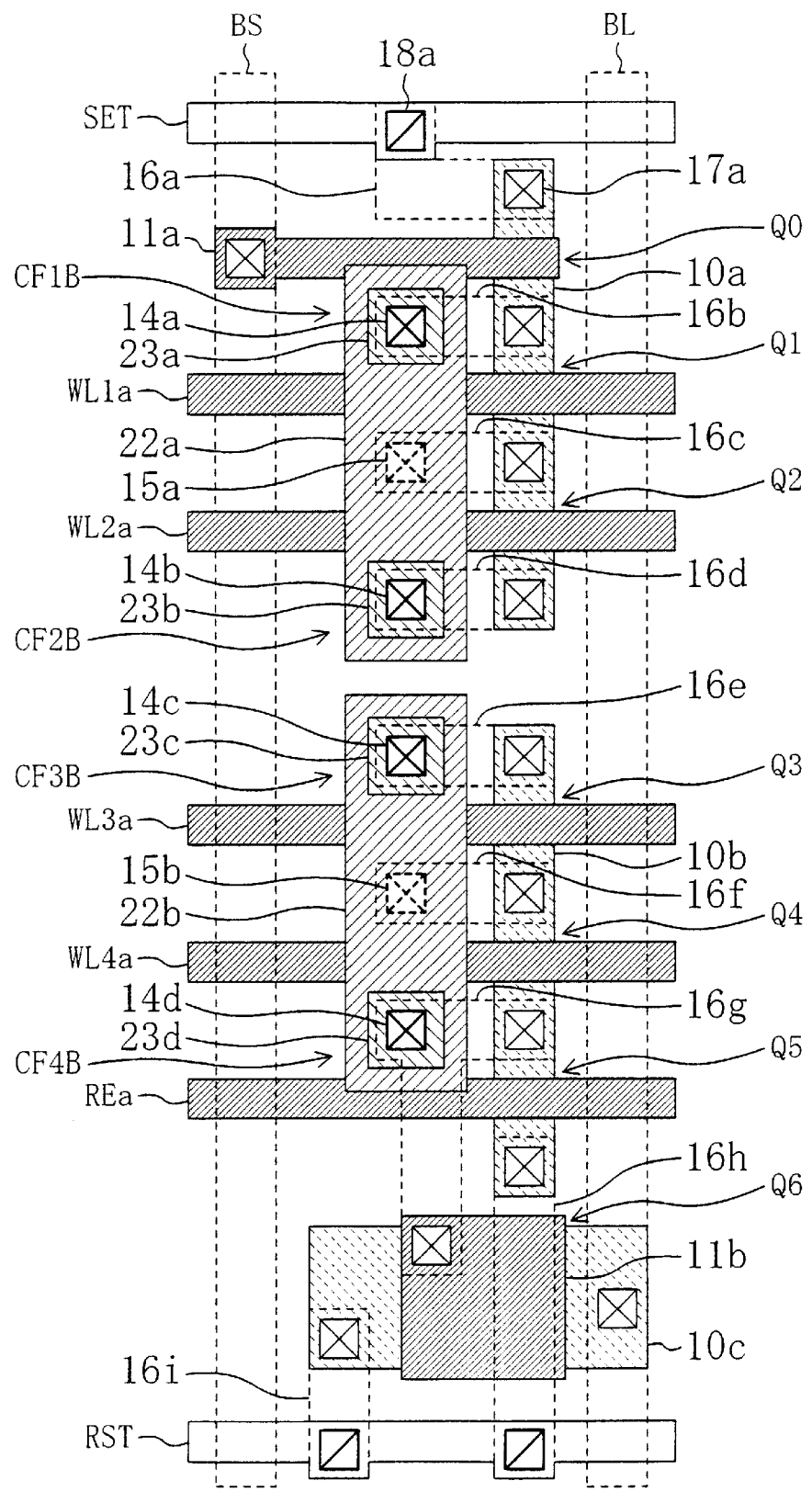
FIG. 5 is a plane view of the semiconductor memory of Embodiment 2.

FIG. 5 is a plane view of the semiconductor memory of Embodiment 2. In the semiconductor memory of FIG. 5, like reference numerals are used to refer to like elements used in the semiconductor memory of FIG. 2 so as to omit the description. Also, ferroelectric capacitors CF1B, CF2B, CF3B and CF4B of FIG. 5 respectively correspond to the ferroelectric capacitors CF1, CF2, CF3 and CF4 of FIG. 1.

In FIG. 5, a reference numeral 22a denotes a lower electrode of the ferroelectric capacitors CF1B and CF2B, a reference numeral 22b denotes a lower electrode of the ferroelectric capacitors CF3B and CF4B, and reference numerals 23a, 23b, 23c and 23d respectively denote the upper electrodes of the ferroelectric capacitors CF1B, CF2B, CF3B and CF4B. Accordingly, an overlap region between the lower electrode 22a and the upper electrode 23a corresponds to the ferroelectric capacitor CF1B, an overlap region between the lower electrode 22a and the upper electrode 23b corresponds to the ferroelectric capacitor CF2B, an overlap region between the lower-electrode 22b and the upper electrode 23c corresponds to the ferroelectric capacitor CF3B, and an overlap region between the lower electrode 22b and the upper electrode 23d corresponds to the ferroelectric capacitor CF4B.

In Embodiment 2, a data write operation and a data read operation are carried out in the same manner as described in Embodiment 1, but Embodiment 2 is characterized by applying a different reading voltage depending upon the address of a ferroelectric capacitor to be read in a read operation.

In Embodiment 2, in the first series circuit including the plural serially connected ferroelectric capacitors CF1B, CF2B, CF3B and CF4B, a reading voltage applied in reading a data is lower in a ferroelectric capacitor disposed in a position relatively near to the upper end of the first series circuit than in a ferroelectric capacitor disposed in a position relatively far from the upper end. Specifically, a reading voltage for reading a data from the ferroelectric capacitor CF1B on the first row is lower than a reading voltage for reading a data from the ferroelectric capacitor CF2B on the second row, the reading voltage for reading a data from the ferroelectric capacitor CF2B on the second row is lower than a reading voltage for reading a data from the ferroelectric capacitor CF3B on the third row, and the reading voltage for reading a data from the ferroelectric capacitor CF3B on the third row is lower than a reading voltage for reading a data from the ferroelectric capacitor CF4B on the fourth row. In this case, the reading voltages are made different in accordance with the parasitic capacitances of the ferroelectric capacitors in the respective addresses obtained in Embodiment 1.

Now, the reading voltages for reading data from the ferroelectric capacitors CF1B, CF2B, CF3B and CF4B will be specifically described.

For example, when the reading voltage for reading a data from the ferroelectric capacitor CF4B on the fourth row is assumed to be 2 V, the reading voltage for reading a data from the ferroelectric capacitor CF3B on the third row is set to 1.81 V, that is, 2 V×(1−17 fF/(166 fF+17 fF)), the reading voltage for reading a data from the ferroelectric capacitor CF2B on the second row is set to 1.69 V, that is, 2 V×(1−31 fF/(166 fF+31 fF)), and the reading voltage for reading a data from the ferroelectric capacitor CF1B on the first row is set to 1.58 V, that is, 2 V×(1−44 fF/ (166 fF+44 fF)).

An operation for reading a data "1" will now be described by using a hysteresis line and capacitance load lines shown in FIG. 6.

Figure 6:
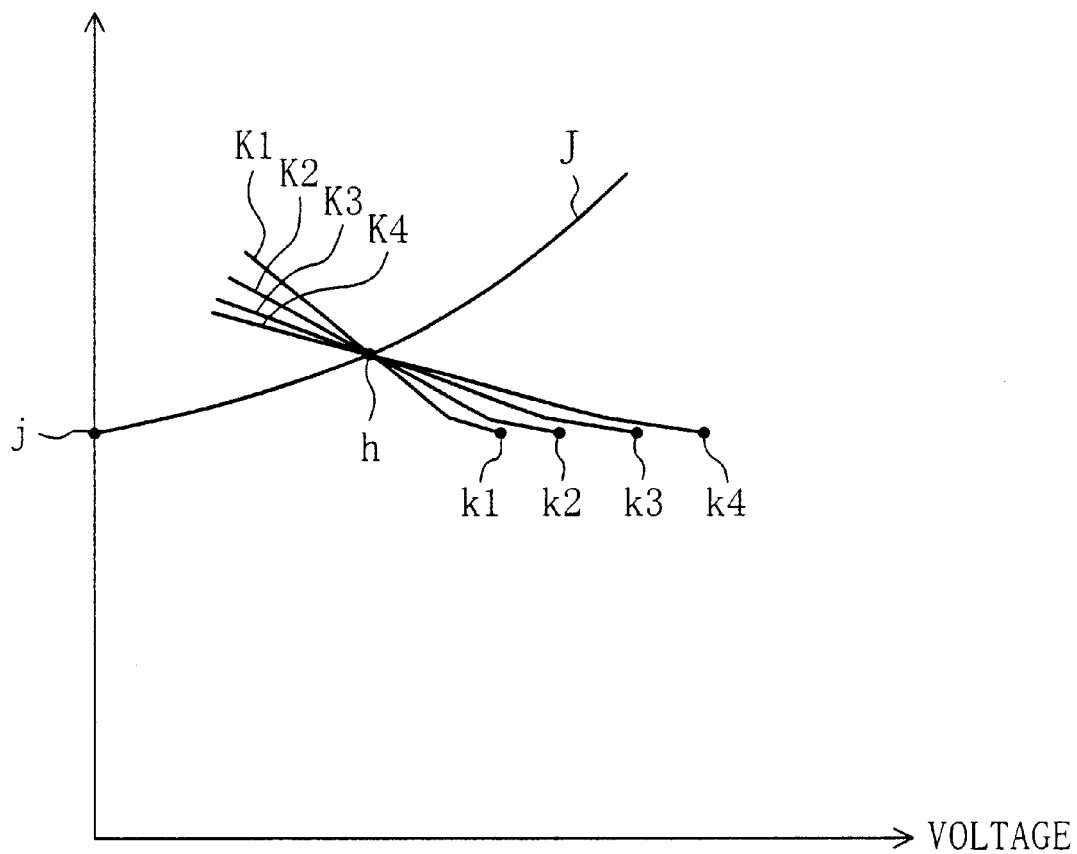
FIG. 6 is a diagram for explaining the relationship between voltage and polarization in reading a data "1" in the semiconductor memory of Embodiment 2.
Figure 7:
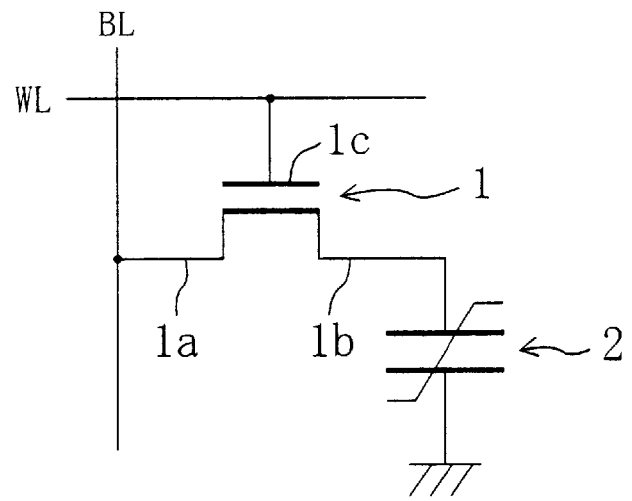
FIG. 7 is an equivalent circuit diagram of a memory cell included in a semiconductor memory according to a first conventional example.
Figure 8:
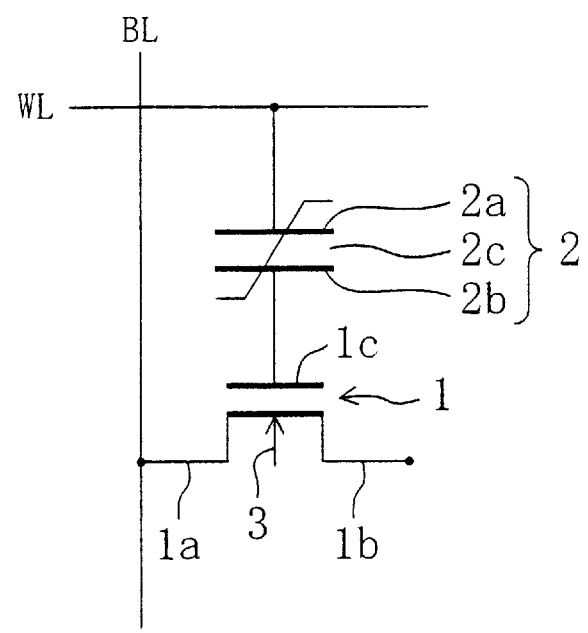
FIG. 8 is an equivalent circuit diagram of a memory cell included in a semiconductor memory according to a second conventional example.
Figure 9:
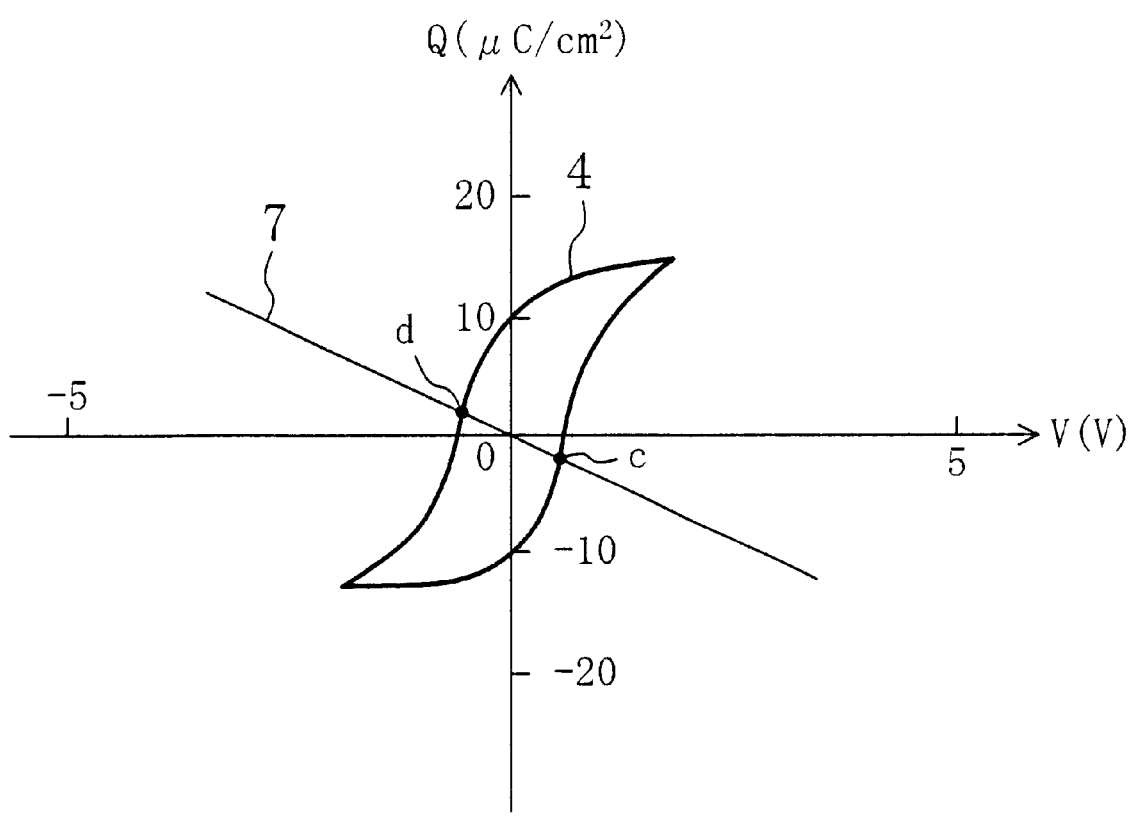
FIG. 9 is a diagram for explaining behavior of charge and voltage in a read operation of the semiconductor memory of the second conventional example.
Figure 10:
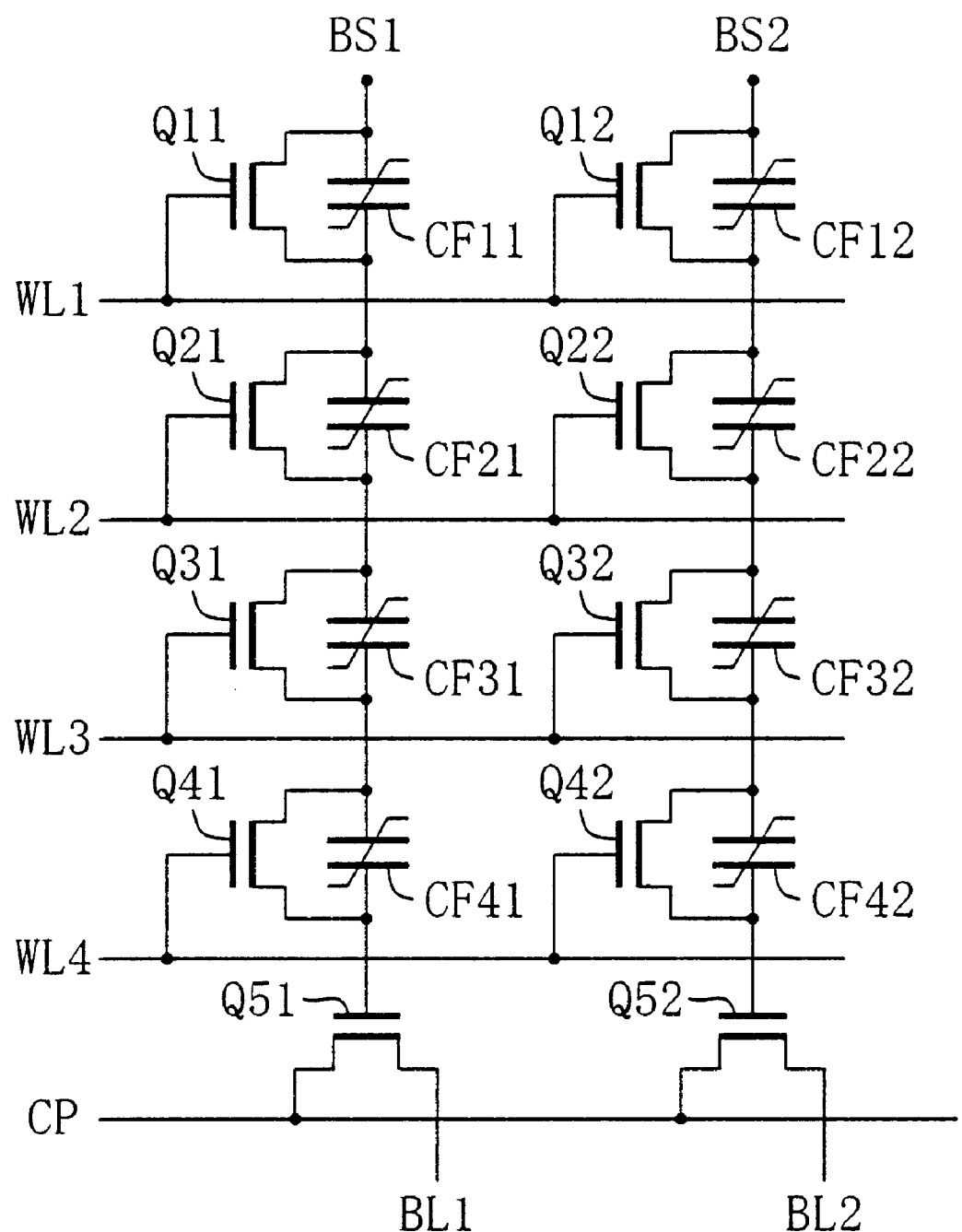
FIG. 10 is an equivalent circuit diagram of a semiconductor memory set forth as a premise of the invention.

In FIG. 6, a point j denotes a retention operation point, a line J denotes a hysteresis line drawn from the retention operation point j in applying a positive voltage to the ferroelectric capacitor, lines K1, K2, K3 and K4 respectively denote capacitance load lines of the ferroelectric capacitors CF1B, CF2B, CF3B and CF4B, points k1, k2, k3 and k4 respectively denote the reading voltages for reading data from the ferroelectric capacitors CF1B, CF2B, CF3B and CF4B, and a point h denotes a read operation point.

The gradients of the capacitance load lines K1, K2, K3 and K4 are sums of the gate capacitance of the reading transistor Q6 and the respective parasitic capacitances, which are larger in the order of the ferroelectric capacitors CF4B, CF3B, CF2B and CF1B.

In Embodiment 2, since the reading voltages are different depending upon the addresses as shown with the points k1, k2, k3 and k4, the read operation point h, that is, the intersection between the hysteresis line J obtained in applying a positive voltage to the ferroelectric capacitor corresponding to the retention operation point j and the capacitance load lines K1, K2, K3 and K4, is the same regardless of the addresses. Accordingly, the variation in the gate potential of the reading transistor Q6 depending upon the addresses can be prevented.

In each of Embodiments 1 and 2, the reading transistor Q6 is used as the load capacitor, and a voltage obtained by dividing the reading voltage in accordance with a ratio between the capacitance of the ferroelectric capacitor and the gate capacitance of the reading transistor Q6 is applied to the gate electrode of the reading transistor Q6, so that a data stored in the ferroelectric capacitor can be read by detecting a difference in the current flowing between the drain region and the source region of the reading transistor Q6 in accordance with the gate potential. However, the reading transistor Q6 may be replaced with another load capacitor. For example, the reading transistor Q6 may be replaced with a line, so that a voltage obtained by dividing the reading voltage in accordance with a ratio between the capacitance of the ferroelectric capacitor and the line capacitance of the line can be applied to the line so as to be detected by a sense amplifier.

Furthermore, in the case where the reading transistor Q6 is used as the load capacitor, the reading voltage is preferably set to such magnitude that the voltage obtained by dividing the reading voltage in accordance with the ratio between the capacitance of the ferroelectric capacitor and the gate capacitance of the reading transistor Q6 is lower than the coercive voltage of the ferroelectric capacitor.

Thus, the displacement of the polarization of the ferroelectric film can be restored to that obtained before reading a data, and hence, there is no need to carry out a rewrite operation. As a result, the fatigue characteristic of the ferroelectric capacitor can be very effectively improved.

What is claimed is:

1. A semiconductor memory comprising:
   a plurality of ferroelectric capacitors successively connected to one another in a bit line direction each for storing a data in accordance with displacement of polarization of a ferroelectric film thereof;
   a plurality of selecting transistors respectively connected to said plurality of ferroelectric capacitors in parallel for selecting a selected ferroelectric capacitor from said plurality of ferroelectric capacitors;
   a set line connected to a first end of a series circuit including said plurality of successively connected ferroelectric capacitors, a reading voltage being applied to said set line; and
   a load capacitor connected to a second end of said series circuit for detecting displacement of polarization of the ferroelectric film of said selected ferroelectric capacitor,
   wherein, in said series circuit, capacitance is larger in a ferroelectric capacitor disposed in a position relatively near to said first end than in a ferroelectric capacitor disposed in a position relatively far from said first end.

2. The semiconductor memory of claim 1,
   wherein the capacitance of each of said ferroelectric capacitors is set to be in proportion to a sum of parasitic capacitance present between said ferroelectric capacitor and said load capacitor, and capacitance of said load capacitor.

3. The semiconductor memory of claim 1,
   wherein, in said series circuit, one electrode having a smaller area between two electrodes of each of said plurality of ferroelectric capacitors has a larger area in a ferroelectric capacitor disposed in a position relatively near to said first end than in a ferroelectric capacitor disposed in a position relatively far from said first end.

4. The semiconductor memory of claim 1,
   wherein, in said series circuit, the ferroelectric film has a smaller thickness in a ferroelectric capacitor disposed in a position relatively near to said first end than in a ferroelectric capacitor disposed in a position relatively far from said first end.

5. The semiconductor memory of claim 1,
   wherein, in said series circuit, an amount of a dopant added to the ferroelectric film is larger in a ferroelectric capacitor disposed in a position relatively near to said first end than in a ferroelectric capacitor disposed in a position relatively far from said first end.

6. The semiconductor memory of claim 1,
   wherein said reading voltage applied to said set line is set to such magnitude that a voltage applied between two electrodes of said selected ferroelectric capacitor in applying said reading voltage is not more than a coercive voltage of said selected ferroelectric capacitor.

7. The semiconductor memory of claim 1,
   wherein said load capacitor is a field effect transistor whose gate electrode is connected to said second end of said series circuit.

8. A method for driving a semiconductor memory,
   said semiconductor memory including a plurality of ferroelectric capacitors successively connected to one another in a bit line direction each for storing a data in accordance with displacement of polarization of a ferroelectric film thereof; a plurality of selecting transistors respectively connected to said plurality of ferroelectric capacitors in parallel for selecting a selected ferroelectric capacitor from said plurality of ferroelectric capacitors; a set line connected to a first end of a series circuit including said plurality of successively connected ferroelectric capacitors, a reading voltage being applied to said set line; and a load capacitor connected to a second end of said series circuit for detecting displacement of polarization of the ferroelectric film of said selected ferroelectric capacitor, with capacitances of said plurality of ferroelectric capacitors being set to be equal to one another, said method comprising:
   a step of setting said reading voltage applied to said set line to be lower in reading a data from a ferroelectric capacitor disposed in a position in said series circuit relatively near to said first end than in reading a data from a ferroelectric capacitor disposed in a position relatively far from said first end.

9. The method for driving a semiconductor memory of claim 8,
   wherein magnitude of said reading voltage is set to be in reverse proportion to a sum of parasitic capacitance present between said selected ferroelectric capacitor and said load capacitor, and capacitance of said load capacitor.

10. The method for driving a semiconductor memory of claim 8,
    wherein said reading voltage applied to said set line is set to such magnitude that a voltage applied between two electrodes of said selected ferroelectric capacitor in applying said reading voltage is not more than a coercive voltage of said selected ferroelectric capacitor.

11. The method for driving a semiconductor memory of claim 8,
    wherein said load capacitor is a field effect transistor whose gate electrode is connected to said second end of said series circuit.

* * * * *

UNITED STATES PATENT AND TRADEMARK OFFICE
CERTIFICATE OF CORRECTION

PATENT NO. : 6,456,520 B1
DATED : September 24, 2002
INVENTOR(S) : Yoshihisa Kato et al.

It is certified that error appears in the above-identified patent and that said Letters Patent is hereby corrected as shown below:

Column 12,
Line 34 through line 42,
"In the semiconductor memory of FIG. 2, the gate widths of the block selecting transistor Q0, the cell selecting transistors Q1, Q2, Q3 and Q4 and the writing transistor Q5 are set to 2.2ìm and the gate lengths thereof are set to 0.8ìm. The gate width of the reading transistor Q6 is set to 24.0ìm and the gate length thereof is set to 3.0ìm. The gate insulating film of each of the transistors Q0, Q1, Q2, Q3, Q4, Q5 and Q6 is made from a silicon dioxide film having a thickness of 15 nm and a dielectric constant of 3.9."
should read
-- In the semiconductor memory of FIG. 2, the gate widths of the block selecting transistor Q0, the cell selecting transistors Q1, Q2, Q3 and Q4 and the writing transistor Q5 are set to $2.2\mu m$ and the gate lengths thereof are set to $0.8\mu m$. The gate width of the reading transistor Q6 is set to $24.0\mu m$ and the gate length thereof is set to $3.0\mu m$. The gate insulating film of each of the transistors Q0, Q1, Q2, Q3, Q4, Q5 and Q6 is made from a silicon dioxide film having a thickness of 15 nm and a dielectric constant of 3.9. --

Line 48 through line 55,
"Furthermore, in each of the block selecting transistor Q0, the cell selecting transistors Q1, Q2, Q3 and Q4 and the writing transistor Q5, the area of heavily-doped layers serving as the source region and the drain region is $5.3\text{ìm}^2$ and parasitic capacitance including junction capacitance with a substrate and the like is 5 fF. The sizes of the ferroelectric capacitors CF1A, CF2A, CF3A, and CF4A are determined in consideration of the parasitic capacitances."
should read
-- Furthermore, in each of the block selecting transistor Q0, the cell selecting transistors Q1, Q2, Q3 and Q4 and the writing transistor Q5, the area of heavily-doped layers serving as the source region and the drain region is $5.3\mu m^2$ and parasitic capacitance including junction capacitance with a substrate and the like is 5 fF. The sizes of the ferroelectric capacitors CF1A, CF2A, CF3A, and CF4A are determined in consideration of the parasitic capacitances. --

UNITED STATES PATENT AND TRADEMARK OFFICE
CERTIFICATE OF CORRECTION

PATENT NO. : 6,456,520 B1
DATED : September 24, 2002
INVENTOR(S) : Yoshihisa Kato et al.

It is certified that error appears in the above-identified patent and that said Letters Patent is hereby corrected as shown below:

Column 12, line 56 through Column 13, line 5
"As shown in FIG. 2, the area of the upper electrode 13a of the ferroelectric capacitor CF1A disposed on the first row is larger than the area of the upper electrode 13b of the ferroelectric capacitor CF2A disposed on the second row; the area of the upper electrode 13b of the ferroelectric capacitor CF2A disposed on the second row is larger than the area of the upper electrode 13c of the ferroelectric capacitor CF3A disposed on the third row; the area of the upper electrode 13c of the ferroelectric capacitor CF3A disposed on the third row is larger than the area of the upper electrode 13d of the ferroelectric capacitor CF4A disposed on the fourth row; and the area of the upper electrode 13d of the ferroelectric capacitor CF4A disposed on the fourth row is set to 25ìm$^2$. The areas of the upper electrodes 13a, 13b, 13c and 13d are determined on the basis of parasitic capacitances respectively present between the reading transistor Q6 and the ferroelectric capacitors CF1A, CF2A, CF3A and CF4A."
should read
-- As shown in FIG. 2, the area of the upper electrode 13a of the ferroelectric capacitor CF1A disposed on the first row is larger than the area of the upper electrode 13b of the ferroelectric capacitor CF2A disposed on the second row; the area of the upper electrode 13b of the ferroelectric capacitor CF2A disposed on the second row is larger than the area of the upper electrode 13c of the ferroelectric capacitor CF3A disposed on the third row; the area of the upper electrode 13c of the ferroelectric capacitor CF3A disposed on the third row is larger than the area of the upper electrode 13d of the ferroelectric capacitor CF4A disposed on the fourth row; and the area of the upper electrode 13d of the ferroelectric capacitor CF4A disposed on the fourth row is set to $25\mu m^2$. The areas of the upper electrodes 13a, 13b, 13c and 13d are determined on the basis of parasitic capacitances respectively present between the reading transistor Q6 and the ferroelectric capacitors CF1A, CF2A, CF3A and CF4A. --

Column 13,
Line 20 through line 24,
"Accordingly, the area of the upper electrode 13c of the ferroelectric capacitor CF3A on the third row is set to 27.3ìm$^2$, that is, the area of the upper electrode 13d of the ferroelectric capacitor CF4A on the fourth row (25ìm$^2$)x(1+17 fF/ (166 fF+17 fF))."
should read
-- Accordingly, the area of the upper electrode 13c of the ferroelectric capacitor CF3A on the third row is set to $27.3\mu m^2$, that is, the area of the upper electrode 13d of the ferroelectric capacitor CF4A on the fourth row $(25\mu m^2)$x(1+17 fF/ (166 fF+17 fF)). --

UNITED STATES PATENT AND TRADEMARK OFFICE
CERTIFICATE OF CORRECTION

PATENT NO. : 6,456,520 B1
DATED : September 24, 2002
INVENTOR(S) : Yoshihisa Kato et al.

It is certified that error appears in the above-identified patent and that said Letters Patent is hereby corrected as shown below:

Column 13, (cont.)
Line 25 through line 33, "Similarly, the area of the upper electrode 13*b* of the ferroelectric capacitor CF2A on the second row is set to $28.9\text{im}^2$, that is, the area of the upper electrode 13*d* of the ferroelectric capacitor CF4A on the fourth row $(25\text{im}^2) \times (1+31 \text{ fF}/(166 \text{ fF}+31 \text{ fF}))$. The area of the upper electrode 13*a* of the ferroelectric capacitor CF1A on the first row is set to $30.2\text{im}^2$, that is, the area of the upper electrode 13*d* of the ferroelectric capacitor CF4A on the fourth row $(25\text{im}^2) \times (1+44 \text{ fF}/(166 \text{ fF}+44 \text{ fF}))$."
should read
-- Similarly, the area of the upper electrode 13*b* of the ferroelectric capacitor CF2A on the second row is set to $28.9\mu\text{m}^2$, that is, the area of the upper electrode 13*d* of the ferroelectric capacitor CF4A on the fourth row $(25\mu\text{m}^2) \times (1+31 \text{ fF}/(166 \text{ fF}+31 \text{ fF}))$. The area of the upper electrode 13*a* of the ferroelectric capacitor CF1A on the first row is set to $30.2\mu\text{m}^2$, that is, the area of the upper electrode 13*d* of the ferroelectric capacitor CF4A on the fourth row $(25\mu\text{m}^2) \times (1+44 \text{ fF}/(166 \text{ fF}+44 \text{ fF}))$. --

Signed and Sealed this

Second Day of December, 2003

JAMES E. ROGAN
*Director of the United States Patent and Trademark Office*